United States Patent
Stegmayr

(10) Patent No.: US 7,692,474 B2
(45) Date of Patent: Apr. 6, 2010

(54) CONTROL CIRCUIT FOR A HIGH-SIDE SEMICONDUCTOR SWITCH FOR SWITCHING A SUPPLY VOLTAGE

(75) Inventor: Thomas Stegmayr, Villingen-Schwenningen (DE)

(73) Assignee: Minebea Co., Ltd., Nagano (JP)

( * ) Notice: Subject to any disclaimer, the term of this patent is extended or adjusted under 35 U.S.C. 154(b) by 0 days.

(21) Appl. No.: 12/126,405

(22) Filed: May 23, 2008

(65) Prior Publication Data

US 2008/0303580 A1   Dec. 11, 2008

(30) Foreign Application Priority Data

Jun. 11, 2007   (DE) .................. 10 2007 127 505

(51) Int. Cl.
   *H03K 17/687*   (2006.01)
(52) U.S. Cl. ...................... 327/427; 327/434
(58) Field of Classification Search .............. 327/427, 327/434
   See application file for complete search history.

(56) References Cited

U.S. PATENT DOCUMENTS

2003/0197543 A1* 10/2003 Imai ........................... 327/427

FOREIGN PATENT DOCUMENTS

JP   2006-270382   10/2006

OTHER PUBLICATIONS

Feuct, Dennis L., "High-Side Gate Drivers," Retrieved May 5, 2008 at http://www.innovatia.com/Design_Center/High-Side%20Drivers.htm.
"Motor Drive Control IC Designer's Manual," International Rectifier Corporation, CA, USA, www.irf.com.

* cited by examiner

*Primary Examiner*—Lincoln Donovan
*Assistant Examiner*—Khareem E Almo
(74) *Attorney, Agent, or Firm*—Duane Morris LLP

(57) ABSTRACT

A high-side semiconductor switch control circuit for switching a positive supply voltage is provided, having a circuit to provide a drive voltage for the high-side semiconductor switch, a driver circuit for driving the high-side semiconductor switch based on the control circuit, wherein both the circuit for providing the drive voltage as well as the driver circuit operate in relation to a floating switching point, an input circuit portion that receives a control signal related to ground, and a level shift circuit portion that is connected between the input circuit portion and the driver circuit portion and set up so as to transform the control signal related to ground into a floating voltage level for the driver circuit portion.

12 Claims, 7 Drawing Sheets

US 7,692,474 B2

CONTROL CIRCUIT FOR A HIGH-SIDE SEMICONDUCTOR SWITCH FOR SWITCHING A SUPPLY VOLTAGE

CROSS-REFERENCE TO RELATED APPLICATIONS

Filed under 35 U.S.C. §371, the present application claims priority under 35 U.S.C. §§119 and 365 of German Patent Application No. 10 2007 027 505.8, filed Jun. 11, 2007, the entirety of which is incorporated herein by reference.

FIELD OF THE INVENTION

The invention relates to a control circuit for a high-side semiconductor switch for switching a supply voltage.

BACKGROUND OF THE INVENTION

High-side semiconductor switches are semiconductor switches that can switch a high supply voltage of several 100 V, such as 320 V direct current voltage. To this effect, they are connected between a positive supply voltage and a floating switching point, which, during switching operations, passes through a voltage range from ground potential to a potential close to the positive supply voltage. High-side semiconductor switches are used, for example, for driving electric motors at the mains voltage or in buck converters. They are generally realized as power transistors, such as MOSFETs (metal oxide field effect transistors) and IGBTs (bipolar transistors with insulated gate electrodes).

Control circuits for high-side semiconductor switches, referred to below in short as high-side control circuits, are described, for example, in "Motor Drive Control IC Designer's Manual" of the International Rectifier Corp., CA, USA (www.irf.com) and on the website www.innovatia.com/design_center/ under "high-side drivers.htm".

Figure 1:
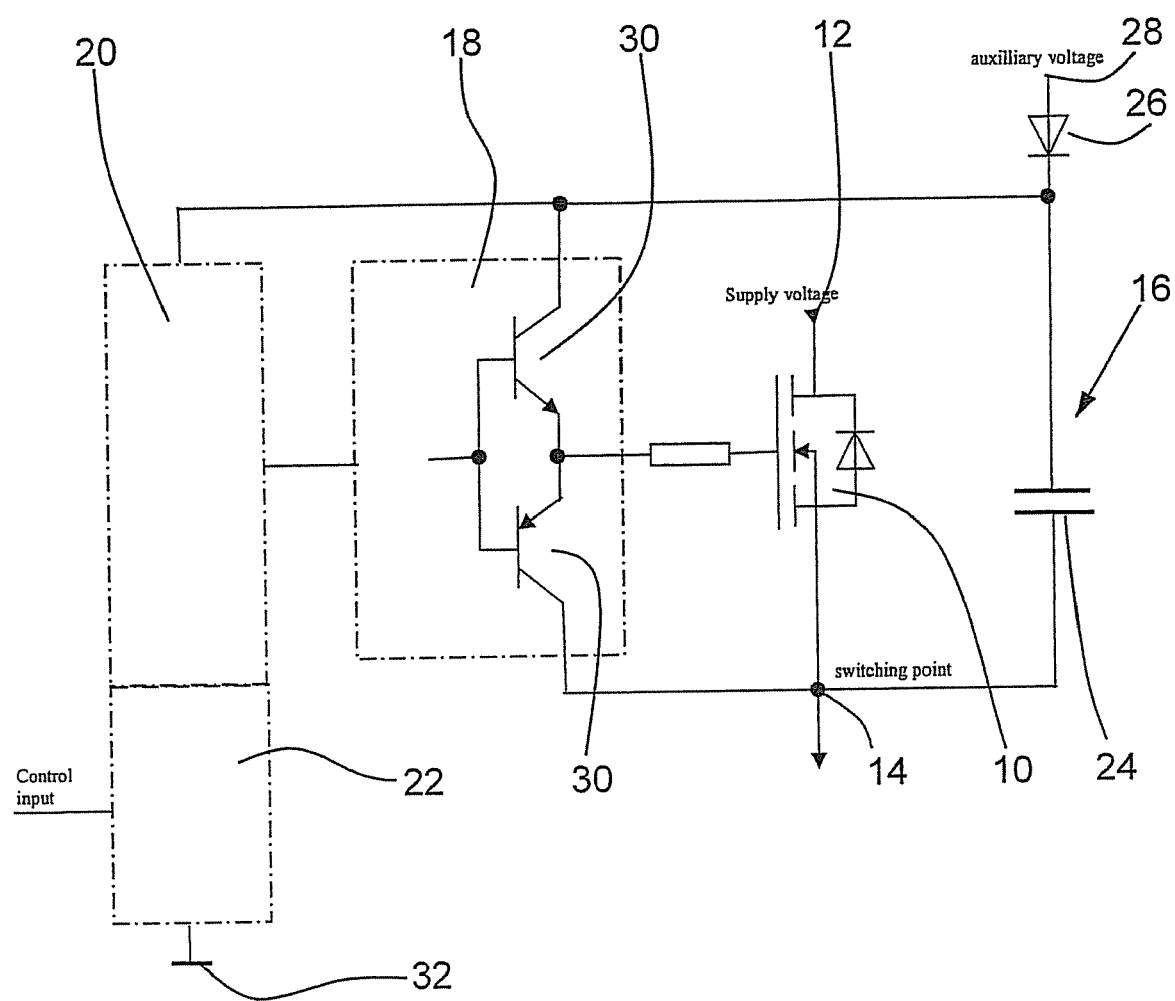

A schematic diagram of a control circuit for a N-channel high-side MOSFET is shown in FIG. 1. FIG. 1 shows an example of a directly-coupled high-side control circuit for a MOSFET or IGBT.

The high-side control circuit shown in FIG. 1 comprises a high-side semiconductor switch 10 that is to be switched, taking the form of a N-channel MOSFET in the illustrated embodiment. The high-side semiconductor switch 10 is connected between a supply voltage 12 and a floating switching point 14. The floating switching point 14 may be connected to ground via a load or a low-side MOSFET (not illustrated in the figure). Four function blocks are provided for driving the high-side semiconductor switch 10:

A circuit 16 for providing a drive voltage for the high-side semiconductor switch 10; a driver circuit 18 for driving the high-side semiconductor switch on the basis of the drive voltage, particularly for charging and discharging the gate of the high-side MOSFET 10; an input circuit 22, that is related to ground and establishes the connection to a control logic, such as a microcontroller; and a level shift circuit 20 that transforms the ground-related control signal into a floating voltage level for the driver circuit.

In order to switch on a N-channel MOSFET and to keep it in a switched-on state, it is necessary to have a voltage potential that is higher than the potential of the positive supply voltage 12. The gate voltage of the high-side MOSFET has to be approximately 10 to 15 V higher than its drain voltage so as to enable the high-side MOSFET to be switched on reliably. However, since the positive supply voltage is applied to the semiconductor switch, the gate voltage has then to be higher than the positive supply voltage, which is frequently the highest voltage that is available in the system. In the prior art, a bootstrap circuit is thus often employed. A bootstrap circuit basically consists of a capacitor 24 that is connected by one of its terminals to the floating switching point 14 and by its other terminal it is connected via a diode 26 to an auxiliary voltage 28. The auxiliary voltage should be between +10 or +15 V. While the high-side semiconductor switch 10 blocks conduction, the bootstrap capacitor 24 is recharged from the auxiliary voltage 28 via the diode 26. The voltage generated at the bootstrap capacitor 24 is not related to ground but rather to the voltage of the floating switching point 14 and is thus also referred to as a floating voltage.

It is further necessary for the gate voltage to be controllable via a logic circuit that is normally related to ground. The control signal level has therefore to be shifted to the level of the source of the high-side semiconductor switch (level shift), this source voltage corresponding to the floating switching point and in most applications oscillating between the positive and the negative supply voltage or respectively between the positive supply voltage and ground.

The driver circuit 18 is supposed to effect the quickest possible charge and discharge of the gate capacitor of the high-side semiconductor switch 10 and is frequently realized by a push-pull circuit having two alternately switching transistors 30. Like the bootstrap capacitor 24, the driver circuit 18 is also based on the floating switching point 14.

The input circuit 22 is related to ground potential 32 and receives a control signal from a control logic, such as from a microcontroller that is not illustrated in the figure. Should the high-side control circuit be used, for example, for driving an electronically commutated DC motor, the control logic may generate the necessary commutation signals. Should the high-side control circuit be used in a buck converter, the control logic predetermines, for example, a desired duty cycle, a desired ON time and a desired cycle duration, in order to adjust the output voltage through the regulated switching on and off of the high-side semiconductor switch.

The level shift circuit 20 serves to transform the ground-related control signal into a floating voltage level for the driver circuit 18. To achieve this, in the prior art, a current is always conducted to ground through a semiconductor switch or a current drain. The current causes a voltage drop in a resistor that is drawn on for driving the driver circuit 18.

The power received by the high-side control circuit should not perceptibly worsen overall efficiency.

Basically, there is the option of having an inverting or a non-inverting control for a high-side semiconductor switch. In the case of the inverting control, the high-side semiconductor switch is switched on when a lower logical voltage level "Low" is applied at the input circuit 22 (Low active). Correspondingly, for a non-inverting control, a higher logical voltage level "High" is required in order to switch on the high-side semiconductor switch 10 (High active). Integrated circuits (IC) are available from various semiconductor manufacturers, such as International Rectifier Corp., in which the above-described function blocks illustrated in FIG. 1 are integrated. An example of this kind of IC is the IR 2110 from International Rectifier Corp. However, the individual function blocks in these ICs are distinctly more complex than as described above and the ICs generally have additional functionalities. In order to provide the drive voltage for the high-side semiconductor switch 10, the user has furthermore to add on, in a discrete circuit, at least the bootstrap capacitor 24 and the diode 26. The known integrated circuits (ICs) are generally well suited for use, for example, in motor electronics. The disadvantage is the high price compared to a purely discrete circuit.

For discretely constructed high-side control circuits, there are often difficulties for motor applications in the region of the level shift circuit that are not acceptable. In the case of a high-active control, it is thus necessary to conduct a current to ground during the ON time of the high-side semiconductor switch, which, for high supply voltages, results in considerable losses and associated component heating. For low-active control circuits, a similar problem arises during switch-off of the high-side semiconductor switch when it directs a current in the reverse direction (reverse current) through its inverse diode, as can happen in motor applications when, after commutation, an electric motor in generator mode feeds back current into the control circuit for a short time. The integrated circuits available on the market solve this problem in that a flip-flop is connected upstream of the driver circuit, which, through a short pulse, can be set or reset respectively. In this solution, a current has only to be conducted to ground during the length of the pulse, whereby losses can be kept low.

Based on this prior art, it is an object of the invention to provide a control circuit for a high-side semiconductor switch for switching a supply voltage, the control circuit being discretely constructed using as few components as possible and thus being cost-effective and nonetheless generating the lowest possible losses during switching operations and even when a reverse current flows through the high-side semiconductor switch. The control circuit is to be preferably used in motor applications and needs a sufficiently rapid switching speed and reliable maintenance of the voltage level in stationary switching states.

SUMMARY OF THE INVENTION

The control circuit for a high-side semiconductor switch according to the invention comprises a circuit to provide a drive voltage for the high-side semiconductor switch, a driver circuit for driving the high-side semiconductor switch based on the control circuit, wherein both the circuit for providing the drive voltage as well as the driver circuit operate in relation to a floating switching point, an input circuit portion that receives a control signal related to ground, and a level shift circuit portion that is connected between the input circuit portion and the driver circuit portion and set up so as to transform the control signal related to ground into a floating voltage level for the driver circuit portion.

According to the invention, the level shift circuit portion is realized by a degeneratively coupled control semiconductor switch, the current negative feedback being formed in two stages. It is designed as a negative feedback circuit portion having a first negative feedback element and a second negative feedback element that are configured such that, depending on the operating status of the high-side semiconductor switch, only one or both of the negative feedback elements are active as current negative feedback for the control semiconductor switch. In a first embodiment, only the first negative feedback element is active as current negative feedback for the control semiconductor switch during the switch-off operation and during the feedback mode of the high-side semiconductor switch, and during the stationary OFF state, a parallel connection of the first and the second negative feedback element acts as current negative feedback for the control semiconductor switch. In a second embodiment of the invention, a series connection of the first and the second negative feedback element is active during the switch-off operation and during the feedback mode of the high-side semiconductor switch, and during the stationary OFF state, only one of the two negative feedback elements is active. In this manner, current negative feedbacks for the control semiconductor switch of varying intensities can be generated depending on the operating status of the high-side semiconductor switch.

The negative feedback circuit preferably comprises a holding transistor and an auxiliary transistor that drives the holding transistor. The first negative feedback element is connected in parallel to the holding transistor, and the second negative feedback element is connected in series to the holding transistor. During the switch-off operation and during feedback mode, the holding transistor and the auxiliary transistor block conduction, so that a relatively large current negative feedback is only generated through the first negative feedback element and the control semiconductor switch operates in the cut-off region and thus limits the current (Stage I). During the stationary OFF state, the holding transistor is switched on by the auxiliary transistor and is conductive, so that the second negative feedback element is connected in parallel to the first negative feedback element and a lower current negative feedback is generated and the control semiconductor switch operates in the ohmic region and becomes fully conductive (Stage II). As mentioned earlier, instead of a parallel connection of the negative feedback elements, a series connection may also be used.

Different resistance values as current negative feedback may thereby be set for the control semiconductor switch, in order, depending on the switching and current supply state of the high-side semiconductor switch, to minimize losses in the control semiconductor switch, or to reliably maintain the stationary OFF state of the high-side semiconductor switch.

In the preferred embodiment, the first and the second negative feedback elements are resistors. The level shift circuit is realized in the preferred embodiment by a degeneratively coupled field effect transistor in a source circuit, the current negative feedback being formed in two stages. By these means, the level shift circuit portion is optimized to the switching states of the high-side semiconductor switch.

The control semiconductor switch receives the ground-related control signal and drives, contingent thereon, the driver circuit portion, wherein the control semiconductor switch is connected between the driver circuit portion and the level shift circuit portion. The control semiconductor switch is preferably a FET or IGBT that is designed such that the entire supply voltage can substantially be applied to it during switching operations.

In the preferred embodiment of the invention, the high-side semiconductor switch is a N-channel power transistor, particularly a N-channel MOSFET. In this case, the drive transistor is preferably a N-channel field effect transistor and the holding transistor is preferably a NPN bipolar transistor.

In one embodiment of the invention, a low-side semiconductor switch is connected in series between the floating switching point and ground to the high-side semiconductor switch. Alternatively, a load may be connected at this point.

In an advantageous embodiment, the driver circuit portion is formed by a push-pull circuit having two semiconductor switches, particularly having two complementary bipolar transistors (NPN & PNP) or having two complementary field effect transistors (N-channel & P-channel).

The circuit for providing the drive voltage for the high-side semiconductor switch expediently comprises a bootstrap capacitor that is connected between the floating switching point and an auxiliary voltage via a diode, as is known in the prior art.

In the preferred embodiment, the control circuit is thus configured to be inverting, so that the high-side semiconductor switch switches on when the ground-related control signal is Low. In conclusion, the invention provides a control circuit for a high-side semiconductor switch that has a discrete construction and, with the appropriate design and choice of components, may be distinctly more cost-effective than using an integrated circuit. In the preferred embodiment of the invention, the control circuit operates with a high-side MOSFET or IGBT on a nominal supply voltage of several 100 V, such as a positive DC voltage of 320 V.

The invention is particularly suited for driving electronically commutated DC machines in which, after commutation, a reverse current may flow through the high-side semiconductor switch, so that the motor feeds back energy into the control circuit. This reverse mode generally represents less than 10% of the operating time of the DC motor, so that during the reverse operation somewhat larger energy losses may be accepted than is the case during regular forward operation. Nevertheless, it is necessary to keep the overall losses in the control circuit as low as possible even with a bidirectional current through the high-side semiconductor switch.

SHORT DESCRIPTION OF THE DRAWINGS

Figure 2:
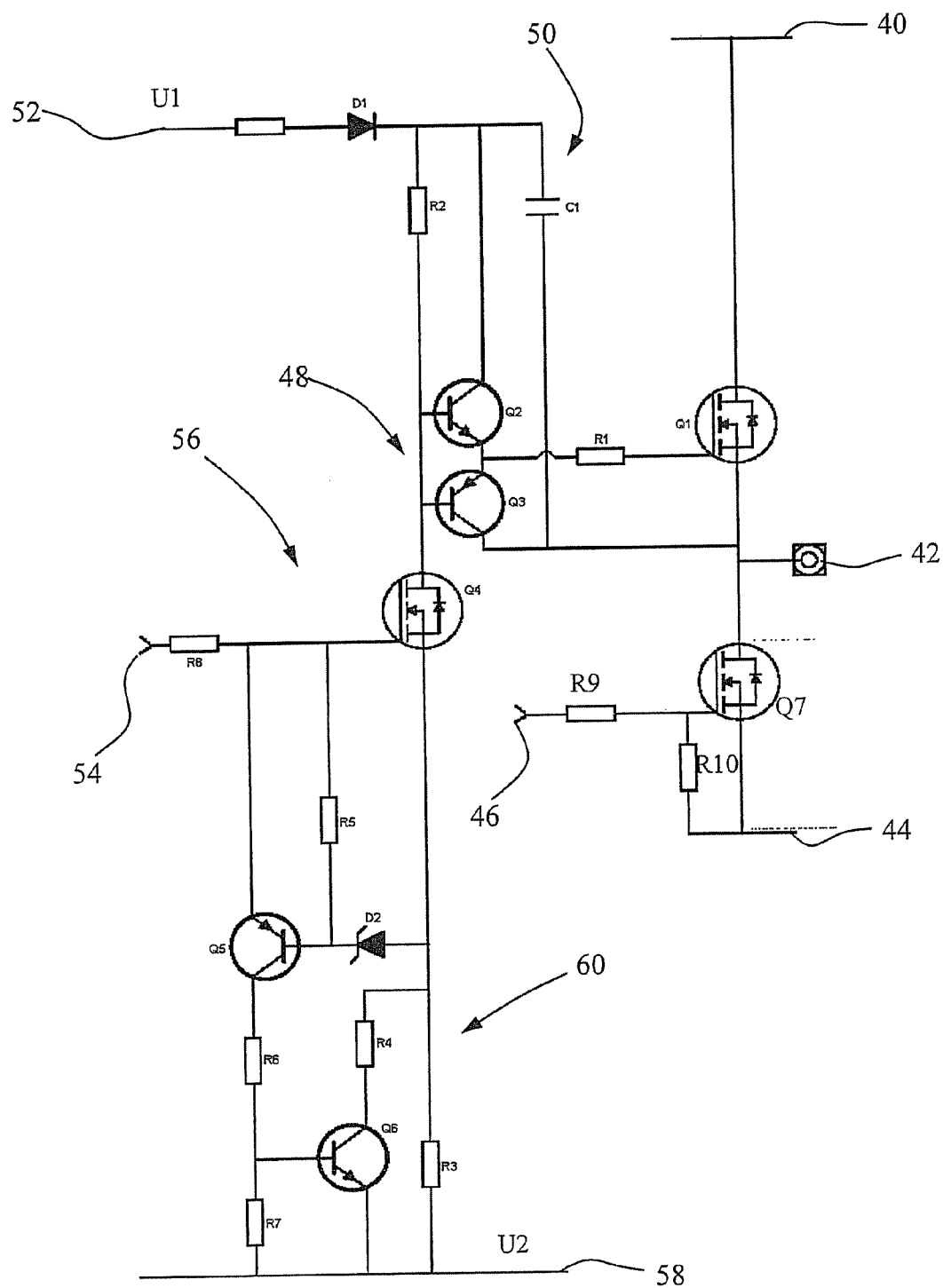
Figure 3:
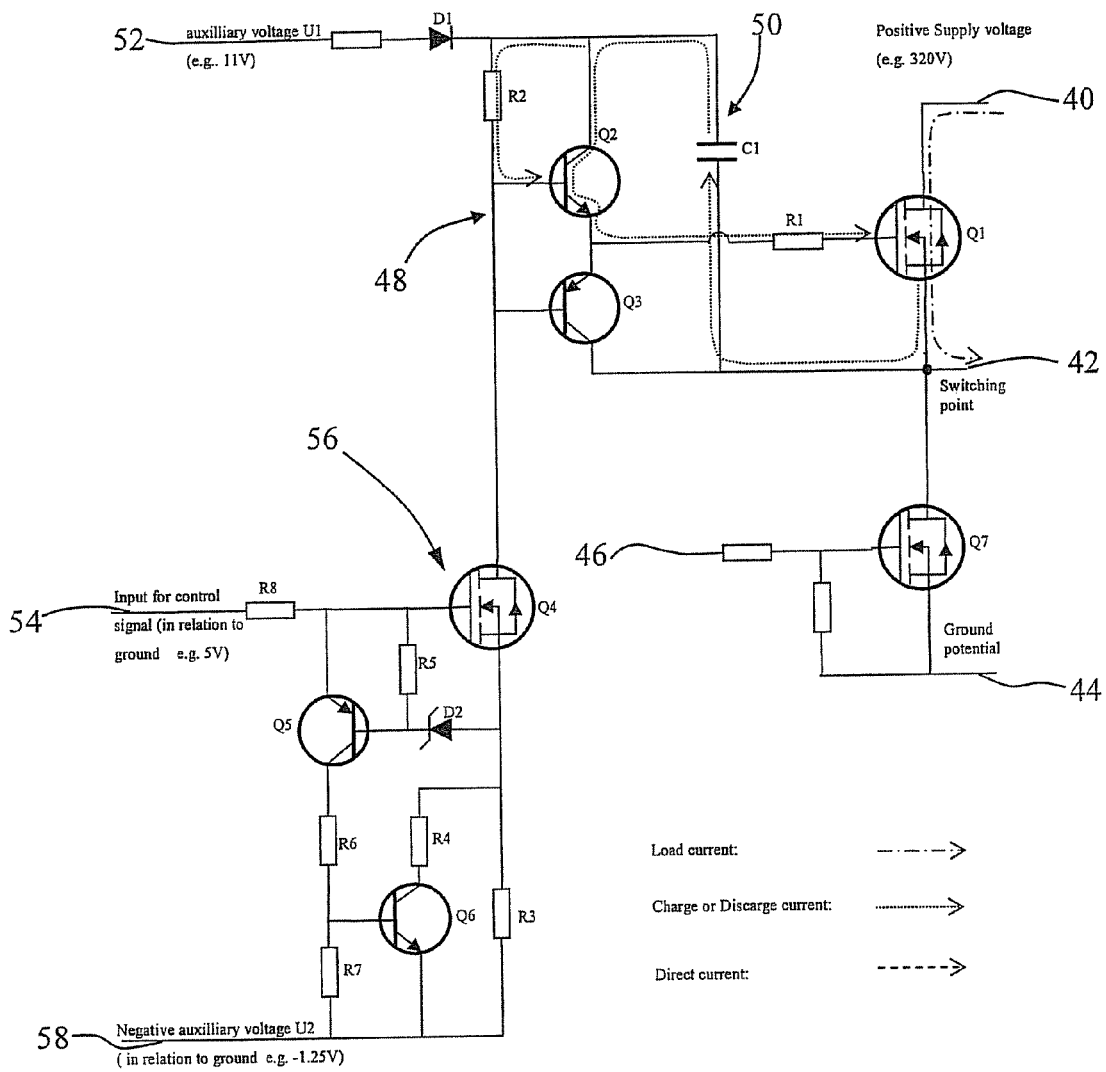
Figure 4:
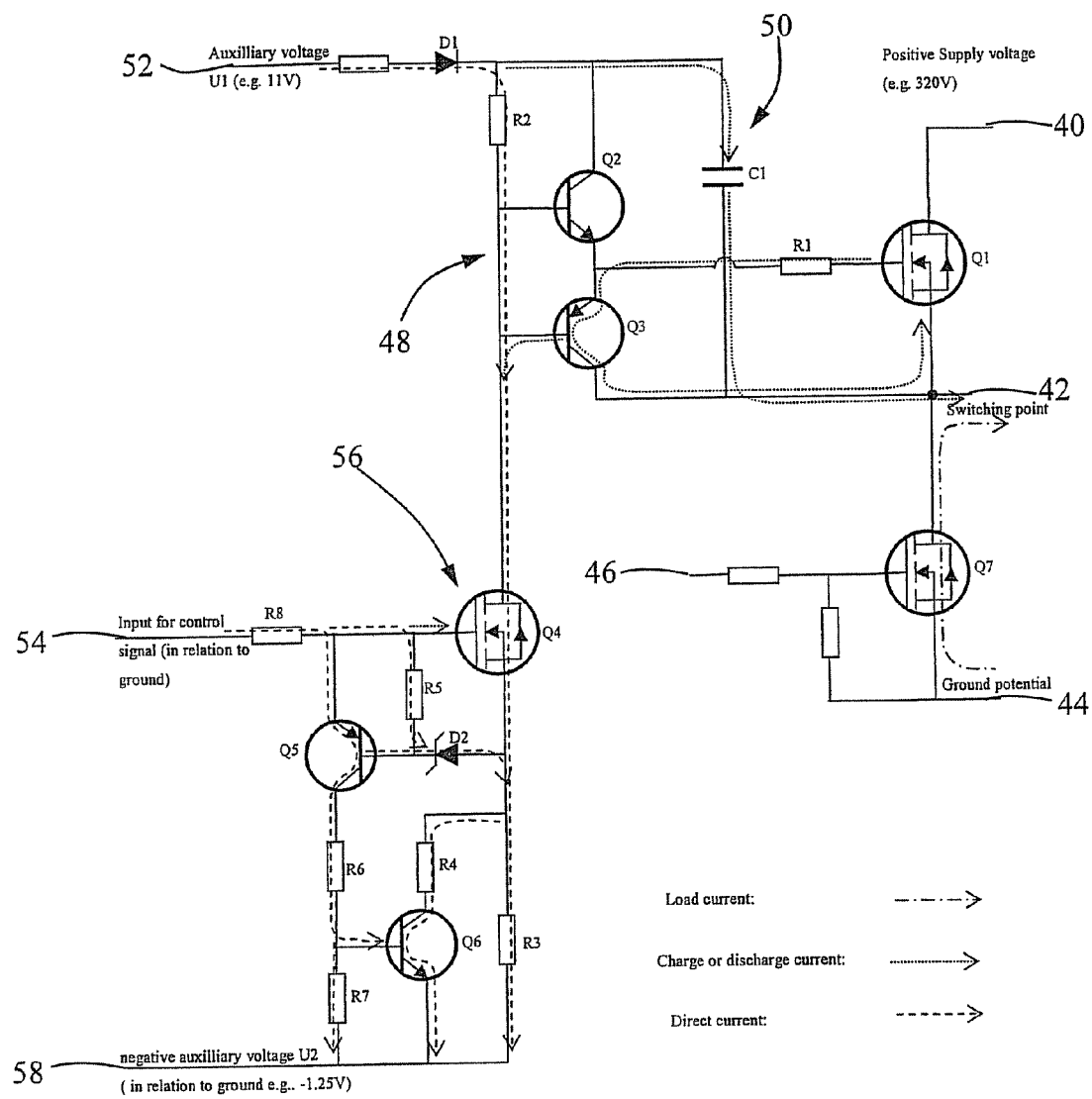
Figure 5:
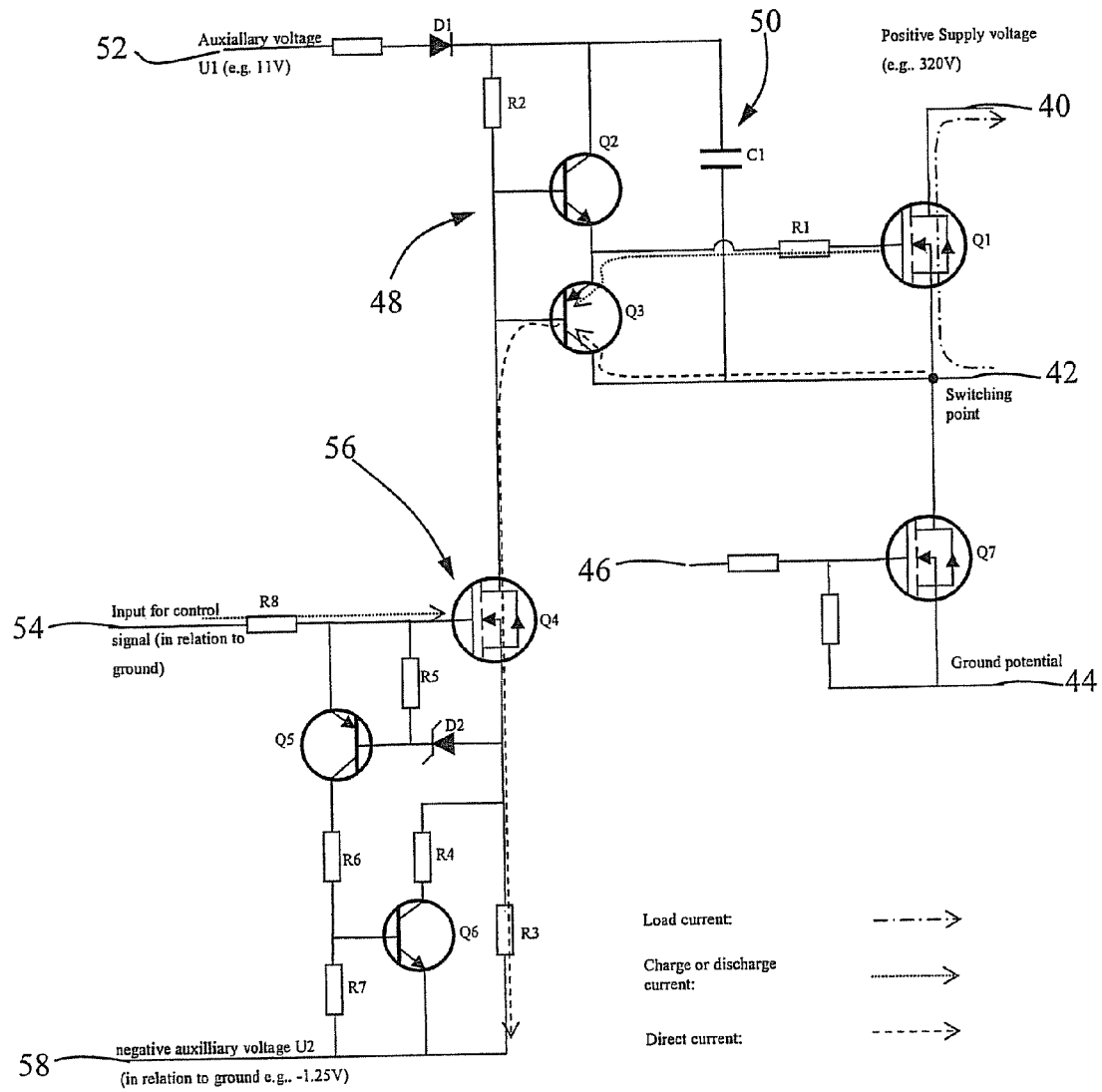
Figure 6:
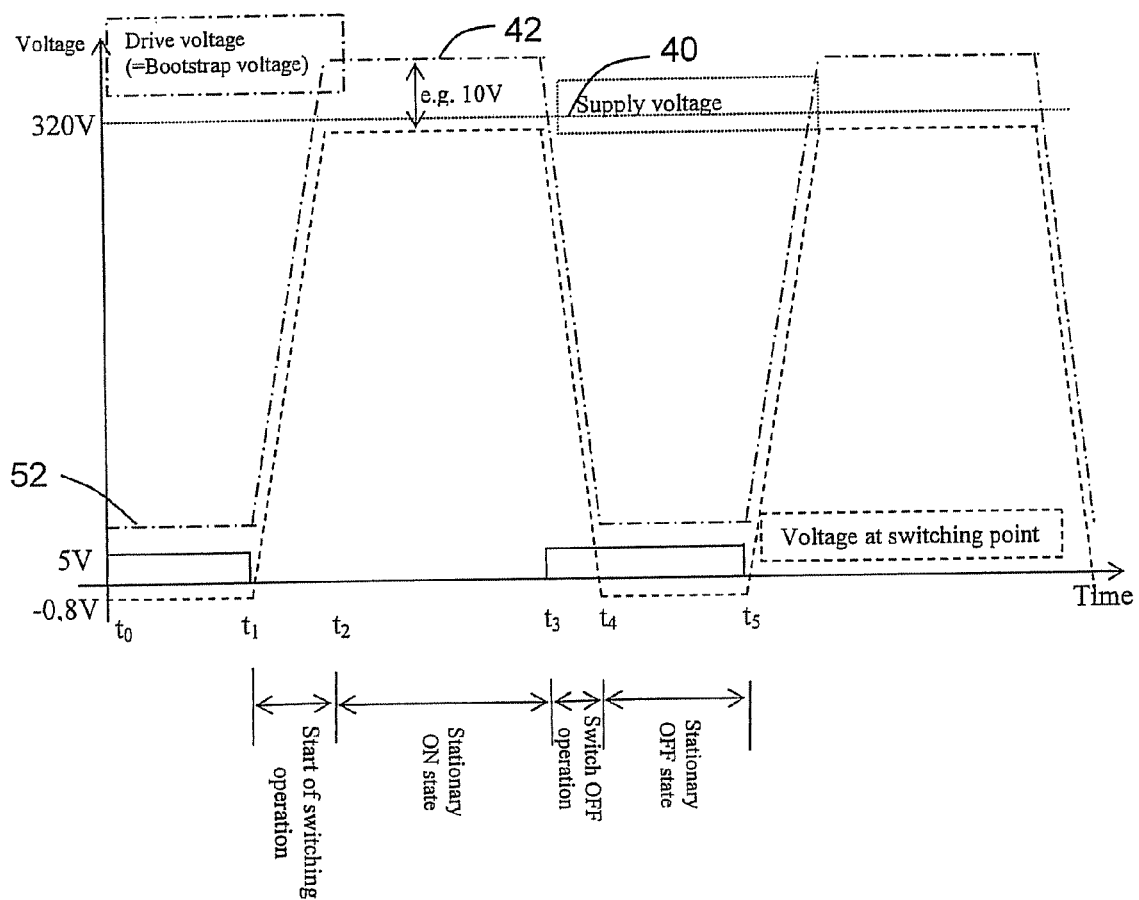
Figure 7:
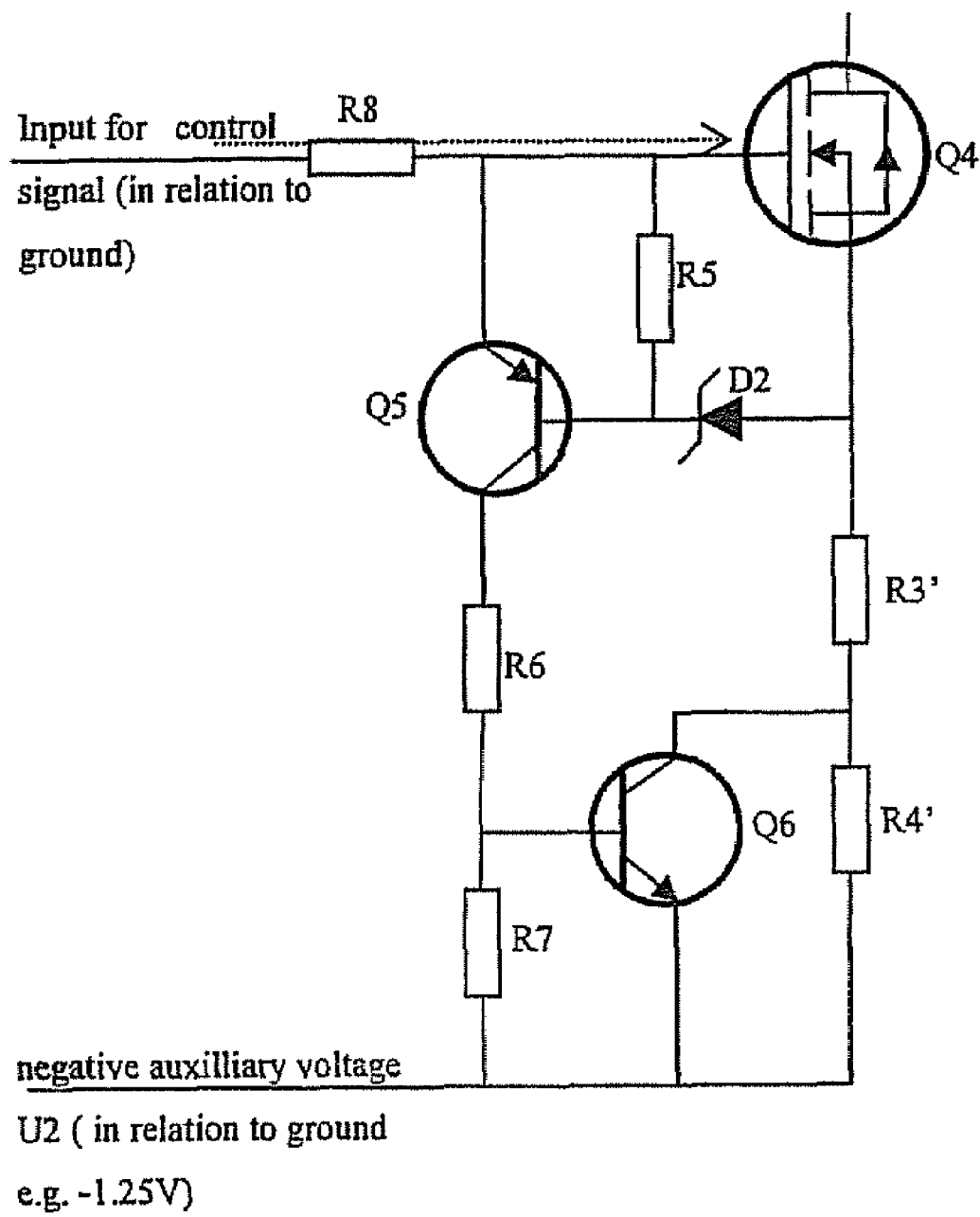

The invention is explained in more detail below on the basis of a preferred embodiment with reference to the drawings. The figures show:

FIG. 1 a schematic diagram of a control for a N-channel high-side MOSFET having the necessary function blocks;

FIG. 2 a circuit diagram of a control circuit for a high-side semiconductor switch according to an embodiment of the invention;

FIG. 3 the circuit diagram of FIG. 2, wherein the currents according to a first switching status are marked in;

FIG. 4 the circuit diagram of FIG. 2, wherein the currents according to a second switching status are marked in;

FIG. 5 the circuit diagram of FIG. 2, wherein the currents according to a third switching status are marked in;

FIG. 6 a voltage diagram to explain the different voltages in the control circuit according to the invention; and FIG. 7 a circuit diagram for an alternative embodiment of the negative feedback circuit portion according to the invention.

DETAILED DESCRIPTION OF PREFERRED EMBODIMENTS

FIG. 2 shows a circuit diagram of a control circuit for a high-side semiconductor switch according to the invention. The circuit of FIG. 2 is basically constructed with the same function blocks that are shown in FIG. 1. The circuit portion for providing the drive voltage for the high-side semiconductor switch and the driver circuit in the illustrated embodiment are constructed in the same way as in the prior art. It is not always possible to unequivocally allocate every component to the respective function blocks; the boundary between two function blocks could more or less run "straight through" a component. In particular, the boundary between the input circuit portion, which receives the ground-related control signal, and the level shift circuit signal, which transforms this control signal into a floating voltage level for the driver circuit, can not be unequivocally drawn.

The embodiment illustrated in FIG. 2 of the control circuit comprises the following components: a high-side power transistor Q1 and a low-side power transistor Q7, which in the illustrated embodiment take the form of MOSFETs, but which could also be, for example, IGBTs; a first push-pull transistor Q2 and a second push-pull transistor Q3, which, in the illustrated embodiment, take the form of an NPN bipolar transistor Q2 and a PNP bipolar transistor Q3; a drive transistor Q4, which, in the illustrated embodiment, takes the form of an N-channel MOSFET, but which could also be, for example, an IGBT; an auxiliary transistor Q5 and a holding transistor Q6, which, in the illustrated embodiment, take the form of a PNP-bipolar transistor and a NPN bipolar transistor; a bootstrap capacitor C1; a bootstrap diode D1; a zener diode D2; and a series of resistors R1 to R10.

The high-side power transistor Q1 corresponds to the high-side MOSFET 10 of FIG. 1. It is connected between a positive supply voltage 40, such as 320 V direct current voltage, and a floating switching point 42, the floating switching point 42 being connected via the low-side power transistor Q7 to ground potential 44. The low-side power transistor Q7 receives a ground-related control signal at an input 46 via resistor R9. The gate of the high-side power transistor Q1 is charged and discharged via a driver circuit portion 48 that comprises the two push-pull-transistors Q2, Q3 and resistor R1.

The drive voltage for the high-side power transistor Q1 is provided via a bootstrap circuit portion 50 that comprises the bootstrap capacitor C1 and the bootstrap diode D1. This bootstrap circuit portion 50 is connected to an auxiliary voltage U1 52 that usually lies in a range of between 10 and 15 V, in order to boost the positive supply voltage 40 by the value of the auxiliary voltage U1 and thus provide sufficiently high drive voltage for the high-side power transistor Q1.

A control signal related to ground potential is applied at input 54 of the control circuit, the control signal being predetermined by a logic circuit, such as a microcontroller, (not illustrated in the figure). The control signal may, for example, be a commutation signal for a DC motor. The control signal is applied via resistor R8 to the gate of the drive transistor Q4, the control signal being boosted via a level shift circuit portion 56 for the driver circuit portion 48 to the potential of the floating switching point 42.

The level shift circuit 56 is substantially formed by the drive transistor Q4 in a source circuit and resistor R2, the negative feedback circuit 60 generating the two-stage current negative feedback for the drive transistor Q4. The two-stage current negative feedback is substantially realized by the holding transistor Q6, the auxiliary transistor Q5, a first negative feedback resistor R3 and a second negative feedback resistor R4. The base of the auxiliary transistor Q5 is driven via the zener diode D2, and, according to its switching status, the auxiliary transistor Q5 drives the base of the holding transistor Q6. The resistors R6 and R7 form a voltage divider in order to adjust the drive voltage for the holding transistor Q6. Depending on the switching status of the holding transistor Q6, the drive transistor Q4 is only connected via resistor R3 to the negative auxiliary voltage U2 58 (transistor Q6 blocks conduction) or connected via the parallel connection of the resistors R3 and R4 to the negative auxiliary voltage U2 58 (transistor Q6 is conductive).

The level shift circuit portion 56 thus operates with a two-stage current negative feedback that is configured as follows: during the switch-off operation and during feedback mode of the high-side power transistor Q1, only the first negative feedback resistor R3 acts as a current negative feedback (Stage I); and during the stationary OFF state, the parallel connection of the first and the second negative feedback resistor R3, R4 acts as a current negative feedback (Stage II) because the holding transistor Q6, switched on by the additional auxiliary transistor Q5, is conductive. In Stage I the large current negative feedback ensures that the drive transistor Q4 limits the current and operates in the cut-off region. In Stage II, the smaller current negative feedback ensures that the drive transistor Q4 becomes fully conductive and thus operates in the ohmic region.

The control circuit in the illustrated embodiment operates in an inverting mode. This means that, by applying a control signal "Low" of approximately 0 V at the input 54 of the control circuit and thus at the drive transistor Q4, the drive transistor is in switch-off state and the high-side power transistor Q1 is switched on. When the logical level of the control signal at the input 54 changes to "High", the switch-off operation begins. The operation of the control circuit according to the invention is explained below with reference to the diagrams in FIGS. 3 to 5 that illustrate three different switching states of the control circuit.

FIG. 3 shows the situation in which the drive transistor Q4 is switched off and the high-side power transistor Q1 is switched on; FIG. 4 shows the situation in which the drive transistor Q4 is switched on and thus the high-side power transistor Q1 is switched off; and FIG. 5 shows the situation in which the drive transistor Q4 is switched on and thus the high-side power transistor Q1 is switched off, wherein, however, via the high-side power transistor Q1, a current flows in a reverse direction, for example, in generator mode of a connected DC motor. In FIGS. 3 to 5, the respective charge or discharge currents for charging and discharging the gate or bases of the various transistors are shown by the dotted lines; the load current that flows via the high-side power transistor Q1 and the low-side power transistor Q7, is shown by the dot and dash lines; and direct currents that flow back from the driver circuit portion 48 and the bootstrap circuit portion 50 into the level shift circuit portion 56, are shown by dashed lines.

With reference to FIG. 3, first the switch-on operation of the high-side power transistor Q1 is described. As mentioned above, the control circuit operates in an inverting mode. Therefore, to switch on the high-side power transistor Q1, a control signal having the low logical voltage level "Low" is applied at the input 54 of the control circuit and, via resistor R8, at the gate of the drive transistor Q4. In this status, no current flows through the small-signal drive transistor Q4, so that this blocks conduction and operates without loss. Assuming that the bootstrap capacitor C1 is charged, the gate source capacitance of the high-side power transistor Q1 is maintained in its charged status via the first push-pull transistor Q2. The high-side power transistor Q1 is thus switched on, and the voltage potential at the floating switching point 42 is approximately equal to the positive supply voltage 40, in the illustrated embodiment, for example, 320 V direct current voltage.

With reference to FIG. 4, switch-off of the high-side power transistor Q1 is now described. When the logical voltage level of the control signal at the input 54 changes to the higher status "High", to a value such as 5V, the switch-off operation commences. The gate source capacitance of the drive transistor Q4 is charged via resistor R8. The drive transistor Q4 becomes conductive and a discharge current flows out of the gate of the high-side power transistor Q1 via resistor R1, the emitter-base diode of the second push-pull transistor Q3, the drive transistor Q4 and resistor R3. The resulting voltage drop at resistor R3 reduces the gate source voltage of the drive transistor Q4. At a constant voltage level of the control signal during the compensation operation, the drive transistor Q4 is thereby degeneratively coupled by resistor R3, by means of which a constant current drain is created. This current drain is adjusted such that the drive transistor Q4 operates within a safe voltage range (safe operating area; SOA) and the emitter-base diode of the second push-pull transistor Q3 is also not overloaded. During this very short switch-off operation, the losses of the small-signal drive transistor Q4, caused by the initial high voltage at the gate of the high-side power transistor Q1, are relatively high. The voltage at the gate of the high-side power transistor Q1 related to ground is made up of the sum of the voltage at the floating switching point 42 and the actual gate-source residual voltage. During the switch-off operation, the potential at the floating switching point 42 drops to approximately ground potential. The high-side power transistor Q1 is now switched off.

This switch-off state has to be maintained as reliably as possible in stationary mode. The current through the drive transistor Q4 and thus through resistor R3 drops to a low value as only the auxiliary voltage U1 52 is available as a driving voltage when the gate of the high-side power transistor Q1 is fully discharged. The voltage drop at resistor R3 decreases proportional to the current through this resistor R3. The lower voltage over resistor R3 causes increased current over the emitter-base diode of the auxiliary transistor Q5 as well as through the zener diode D2. The auxiliary transistor Q5 thereby becomes conductive and via its base voltage divider R6/R7 drives the holding transistor Q6, so that this becomes conductive. With a conductive holding transistor Q6, due to the parallel connection of resistors R3 and R4, a smaller current negative feedback is produced than if only resistor R3 lies in the current path of the drive transistor Q4. Thus over the drain-source path of the drive transistor Q4, there occurs only a small residual saturation voltage, so that the losses at the drive transistor Q4 are low. Through the additional small, negative auxiliary voltage U2 58, the gate-source voltage of the high-side power transistor Q1 can be maintained at a low value.

In this context it should be noted that resistor R3 carries out a double function. On the one hand it acts as a current negative feedback for the drive transistor Q4, and on the other hand it also acts as a sensor resistor for adjusting the base current of the auxiliary transistor Q5.

With reference to FIG. 5, the operating status is described in which the load, such as a connected DC motor, temporarily feeds back energy. This can occur, for example, with a DC motor in multiquadrant operation, when, after commutation, current flows back from the motor into the control circuit. A control signal having the voltage level "High" is applied at the gate of the drive transistor Q4, so that according to the operating status of FIG. 4, the high-side power transistor Q1 is generally switched off. However, when a reverse current is fed back from the load, the inverse diode of the high-side power transistor Q1 becomes conductive. This operating status is non-critical as long as the drive transistor Q4 blocks conduction since no current can then be fed back into the level shift circuit 56.

However, when the drive transistor Q4 is switched on by a control signal having the logical voltage level "High", approximately the full supply voltage 40 is also applied at the source of the high-side power transistor Q1 and thus, via the collector-base diode of the second push-pull transistor Q3, also at the input of the level shift circuit 56. In this situation as in the switch-off operation, the current negative feedback, made up of the drive transistor Q4 and resistor R3, can limit the current to a constant, non-critical value.

Consequently, three stationary switching states can be described that the control circuit according to the invention may have available:

The high-side power transistor Q1 is switched on via the first push-pull transistor Q2; all other transistors are switched off; the current through the high-side power transistor Q1 flows in the forward direction. This situation is shown in FIG. 3.

The high-side power transistor Q1 is switched off via the second push-pull transistor Q3; no load current flows through the high-side power transistor Q1; the drive transistor Q4 is switched on. In this case the auxiliary transistor Q5 maintains adequate base current to switch on the holding transistor Q6; the holding transistor Q6 switches resistor R4 parallel to resistor R3. The base current at the auxiliary transistor Q5 is adequate because the condition:

$$U_{control\ signal} + U2 - I(Q4)*R3 - U_{eb(Q5)} > U_{z(D2)},$$

is fulfilled, $U_{control\ signal}$ being the voltage at the input 54; U2 being the negative auxiliary voltage 58; I(Q4) being the current flowing through the drive transistor Q4t; $U_{eb(Q5)}$ being the emitter-base voltage of the auxiliary transistor Q5; and $U_{z(D2)}$ being the breakdown voltage of the zener diode D2.

The high-side power transistor Q1 is switched off via the second push-pull transistor Q3; the current through the high-side power transistor Q1 flows in the reverse direction; the drive transistor Q4 operates in the cut-off region as a current drain, the resistor R4 for the drive transistor Q4 acting as a current negative feedback and the drive transistor Q4 thereby limiting the current; and all other transistors are switched off.

The fourth switching status, in which the drive transistor Q4 is switched off, the high-side power transistor Q1 is switched on and a current flows in the reverse direction through the high-side power transistor Q1, will not be dealt with in detail here because this status is un-critical.

FIG. 6 shows the voltage waveform in the control circuit according to the invention over time. Between times $t_0$ and $t_3$ as well as $t_3$ and $t_5$, a positive input voltage of, for example, 5 V occurs at the input of the control circuit that corresponds to a high logical input signal. Since the control circuit operates in an inverting mode, the high-side semiconductor switch is switched off during this period of time. Between times $t_1$ and $t_4$ as well as from $t_5$, a signal having a low level, for example, 0 V, occurs at the input 54 of the control circuit, by means of which the high-side semiconductor switch Q1 is switched on. The supply voltage 40 is shown in the diagram at 320 V by a dotted line. The bootstrap voltage, which is generated by the bootstrap circuit portion 50, is shown by a dot and dash line; it lies, for example, 10 V over the voltage in the switching point 42. All voltages are shown related to ground. FIG. 6 graphically shows the start of the switching operation at $t_1$ and the voltage waveform up to the stationary ON state, as well as the start of the switch-off operation at $t_3$ and the waveform of the voltages up to the stationary OFF state. In the ON state of th high-side transistor Q1, the potential of the drive voltage (=bootstrap voltage) lies above the potential of the supply voltage (e.g. 320 V), since this is based on the potential of the switching points. The drive voltage or auxiliary voltage 52 itself, however, only has a magnitude of approximately 10 V.

FIG. 7 shows a circuit diagram of a modified embodiment of the negative feedback circuit portion 60, in which the negative feedback resistors R3 and R4 are not connected in parallel, but rather are connected in series. The mode of operation, however, is substantially the same as described earlier with reference to FIGS. 2 to 5. In the embodiment of FIG. 7, the two-stage current negative feedback is configured as follows: during the switch-off operation and during feedback mode of the high-side power transistor Q1, the first and second negative feedback resistors R3', R4' act in series as a current negative feedback (Stage I); and during the stationary OFF state, only the first negative feedback resistor R3' (Stage II) is active, because the holding transistor Q6, switched on by the auxiliary transistor Q5, is conductive. Thus in Stage I, a larger current negative feedback is generated by the series connection of R3' and R4', so that the drive transistor Q4 limits the current and operates in the cut-off region. In Stage II, a smaller current negative feedback is generated by using only negative feedback resistor R3', so that the transistor Q4 becomes fully conductive and thus operates in the ohmic region.

The invention thus provides a control circuit for a high-side semiconductor switch for switching a positive supply voltage which is made up of only a few discrete components, which generates low losses even for a bidirectional current through the high-side power transistor, which has a sufficiently fast switching speed for motor applications and which reliably maintains the voltage level in the stationary switching states. With a suitable design and choice of components, the control circuit according to the invention may be distinctly more cost-effective than a corresponding circuit that is made up of an integrated circuit.

The characteristics revealed in the above description, the claims and the figures can be important for the realization of the invention in its various embodiments both individually and in any combination whatsoever.

| List of Reference Signs | |
|---|---|
| 10 | High-side semiconductor switch |
| 12 | Supply voltage |
| 14 | Floating switching point |
| 16 | Circuit for providing a drive voltage for a high-side semiconductor switch |
| 18 | Driver circuit |
| 20 | Level shift circuit |
| 22 | Input circuit |
| 24 | Bootstrap capacitor |
| 26 | Diode |
| 28 | Auxiliary voltage |
| 30 | Transistors |
| 32 | Ground potential |
| Q1 | High-side semiconductor switch; high-side power transistor |
| Q2 | First push-pull transistor |
| Q3 | Second push-pull transistor |
| Q4 | Control semiconductor switch; |
| Q5 | Auxiliary transistor |
| Q6 | Holding transistor |
| Q7 | Low-side semiconductor switch; low-side power transistor |
| C1 | Bootstrap capacitor |
| D1 | Bootstrap diode |
| D2 | Zener diode |
| R1 to R10 | Resistors |
| R3, R3' | First negative feedback resistor |
| R4, R4' | Second negative feedback resistor |
| 40 | Positive supply voltage |
| 42 | Floating switching point |
| 44 | Ground potential |
| 46 | Input for control signal |
| 48 | Driver circuit portion |
| 50 | Bootstrap circuit portion |
| 52 | Auxiliary voltage U1 |
| 54 | Input of the control circuit |
| 56 | Level shift circuit portion |
| 58 | Negative auxiliary voltage U2 |
| 60 | Negative feedback circuit portion |

I claim:

1. A control circuit for a high-side semiconductor switch for switching a positive supply voltage, said high-side semiconductor switch being connected between said supply voltage and a floating switching point, said control circuit comprising:

a circuit portion for providing a drive voltage for said high-side semiconductor switch;

a driver circuit portion for driving said high-side semiconductor switch on basis of said drive voltage, said circuit portion for providing said drive voltage and said driver circuit portion operating in relation to said floating switching point;

an input circuit portion for receiving a control signal related to ground; and a level shift circuit portion that is connected between said input circuit portion and said driver circuit portion and configured to transform said control signal related to ground into a floating voltage level for said driver circuit portion;

wherein said level shift circuit portion comprises a degeneratively coupled control semiconductor switch and is coupled to a negative feedback circuit portion, said negative feedback circuit portion comprising a holding transistor, a first negative feedback resistor, and a second negative feedback resistor, and said negative feedback circuit portion configured such that during a switch-off operation of said high-side semiconductor switch, said holding transistor blocks conduction and said first and said second negative feedback resistors generate a relatively large current negative feedback and during a stationary OFF state of said high-side semiconductor switch, said holding transistor is switched on and said first and said second negative feedback resistors generate a low current negative feedback, and wherein said first and said second negative feedback resistor are connected in series and said holding transistor is connected in parallel to said second negative feedback resistor.

2. The control circuit according to claim 1, wherein said negative feedback circuit portion further comprises an auxiliary transistor that drives said holding transistor.

3. The control circuit according to claim 1, wherein said holding transistor is an npn-bipolar transistor.

4. A control circuit for a high-side semiconductor switch for switching a positive supply voltage, said high-side semiconductor switch being connected between said supply voltage and a floating switching point, said control circuit comprising:

a circuit portion for providing a drive voltage for said high-side semiconductor switch;

a driver circuit portion for driving said high-side semiconductor switch on basis of said drive voltage, said circuit portion for providing said drive voltage and said driver circuit portion operating in relation to said floating switching point;

an input circuit portion for receiving a control signal related to ground; and a level shift circuit portion that is connected between said input circuit portion and said driver circuit portion and configured to transform said control signal related to ground into a floating voltage level for said driver circuit portion;

wherein said level shift circuit portion comprises a degeneratively coupled control semiconductor switch and is coupled to a negative feedback circuit portion, said negative feedback circuit portion comprising a first negative feedback element and a second negative feedback element that are configured such that, depending on an operating status of said high-side semiconductor switch, only one or both of said negative feedback elements are active as current negative feedback for said control semiconductor switch, and wherein said circuit portion for providing said supply voltage for said high-side semiconductor switch comprises:

a bootstrap capacitor connected to said floating switching point and to an auxiliary voltage via a diode.

5. The control circuit according to claim 4, wherein said control semiconductor switch receives said control signal related to ground and, contingent thereon, drives said driver circuit portion, and whereby said control semiconductor switch is connected between said driver circuit portion and said negative feedback circuit portion.

6. The control circuit according to claim 4, wherein said control semiconductor switch is a n-channel MOSFET.

7. The control circuit according to claim 4, wherein said high-side semiconductor switch is an n-channel power transistor, particularly a n-channel MOSFET.

8. The control circuit according to claim 4, said control circuit further comprising:

a low-side semiconductor switch connected in series between said floating switching point and ground to said high-side semiconductor switch.

9. The control circuit according to claim 4, wherein said driver circuit portion comprises a push-pull circuit having two semiconductor switches.

10. The control circuit according to claim 4, wherein said control circuit is configured to be inverting, so that said high-side semiconductor switch switches on when said control signal related to ground is logically low.

11. The control circuit according to claim 4, wherein said supply voltage is a positive DC voltage.

12. The control circuit according to claim 9, wherein said semiconductor switches of the push-pull circuit comprise two complementary bipolar transistors or two complementary field effect transistors.

* * * * *

UNITED STATES PATENT AND TRADEMARK OFFICE
CERTIFICATE OF CORRECTION

PATENT NO. : 7,692,474 B2  Page 1 of 1
APPLICATION NO. : 12/126405
DATED : April 6, 2010
INVENTOR(S) : Stegmayr It is certified that error appears in the above-identified patent and that said Letters Patent is hereby corrected as shown below:

On the title page item (30), "10 2007 127 505" should read -- 10 2007 027 505 --.

Signed and Sealed this

Eleventh Day of May, 2010

David J. Kappos
*Director of the United States Patent and Trademark Office*